US007547845B2

(12) United States Patent  (10) Patent No.: US 7,547,845 B2
Azemard  (45) Date of Patent: Jun. 16, 2009

(54) ELECTRICAL CABINET INCLUDING A WIRING SUPPORT

(75) Inventor: Laurent Pierre Francois Jules Azemard, Montpellier (FR)

(73) Assignee: Labinal, Montigny le Bretonneux (FR)

( * ) Notice: Subject to any disclaimer, the term of this patent is extended or adjusted under 35 U.S.C. 154(b) by 289 days.

(21) Appl. No.: 11/565,310

(22) Filed: Nov. 30, 2006

(65) Prior Publication Data

US 2007/0139868 A1 Jun. 21, 2007

(30) Foreign Application Priority Data

Nov. 30, 2005 (FR) .................................. 05 12125

(51) Int. Cl.
*H02G 3/04* (2006.01)
(52) U.S. Cl. .................... 174/72 A; 174/481; 174/480; 174/68.3; 385/134; 385/135; 361/826
(58) Field of Classification Search ................ 174/480, 174/481, 50, 68.3, 68.1, 68.2, 72 A; 385/134, 385/135, 136; 248/68.1, 49, 65, 200; 361/826, 361/600, 825; 220/3.2, 3.7, 4.02
See application file for complete search history.

(56) References Cited

U.S. PATENT DOCUMENTS 4,679,123 A * 7/1987 Young ...................... 174/72 A

| | | | | |
|---|---|---|---|---|
| 5,825,962 A * | 10/1998 | Walters et al. | ............... | 385/135 |
| 6,504,094 B2 * | 1/2003 | Woo et al. | ...................... | 174/50 |
| 6,707,978 B2 * | 3/2004 | Wakileh et al. | ............. | 385/134 |
| 7,171,098 B2 * | 1/2007 | Weinegger | ................... | 385/134 |
| 7,259,325 B2 * | 8/2007 | Pincu et al. | ..................... | 174/50 |
| 7,315,680 B1 * | 1/2008 | Rapp et al. | ................... | 385/134 |
| 7,352,947 B2 * | 4/2008 | Phung et al. | ................. | 385/135 |
| 7,437,048 B2 * | 10/2008 | Farrell et al. | ................. | 385/135 |
| 2005/0115152 A1 | 6/2005 | Levesque et al. | | |

FOREIGN PATENT DOCUMENTS

| | | |
|---|---|---|
| CH | 359166 | 12/1961 |
| CH | 668 155 A5 | 11/1988 |
| DE | 27 13 701 B1 | 8/1978 |
| FR | 2 092 413 | 1/1972 |

* cited by examiner

*Primary Examiner*—Angel R Estrada
(74) *Attorney, Agent, or Firm*—Oblon, Spivak, McClelland, Maier & Neustadt, P.C.

(57) ABSTRACT

An electrical cabinet including an enclosure designed to house a plurality of electrical equipment units, a plurality of electrical cable bundles attached to a face of the enclosure for the electrical connection of the electrical equipment units. The cabinet additionally includes a wiring support including support elements arranged cross-wise whereon electrical cable bundles are assembled, and wherein the wiring support includes fasteners for attachment thereof to the face of the enclosure, the electrical cables being capable of assembly to the wiring support before it is fixed to the enclosure.

22 Claims, 12 Drawing Sheets

ELECTRICAL CABINET INCLUDING A WIRING SUPPORT

The present invention concerns an electrical cabinet designed to accommodate wiring and to house electrical equipment.

More precisely, the invention relates to an electrical cabinet including:

- an enclosure designed to house a plurality of electrical equipment units,
- a plurality of electrical cable bundles attached to a face of the enclosure for the electrical connection of said electrical equipment units.

BACKGROUND OF THE INVENTION

Such electrical cabinets are already known in the art, particularly in the field of aircraft engineering where electronics has a predominant place.

The term enclosure is understood to mean any type of housing structure designed to receive a plurality of electrical equipment units, for instance a shelf unit.

In this particular field, to which the invention is absolutely not limited, the aircraft, such as aeroplanes or helicopters for example, incorporate much electrical or electronic equipment that has to be connected in particular to control elements or to sensors.

For safety reasons, the electrical network in aircraft is most often redundant. This means that the number of electrical equipment units and electrical cables is doubled so that if, for example, one electrical equipment unit fails, a second identical unit is provided to operate instead of the one that has failed.

It will therefore be appreciated that the electrical network of an aircraft comprises a very large number of electrical cables.

In practice, they are most often grouped in bundles, and each of the bundles may correspond to a particular type of signal.

The wiring operation is the operation which generally involves grouping the electrical cables into bundles, attaching these bundles to the face of the enclosure in a highly particular arrangement referred to as "wiring routes" or "cable ways", then connecting the different cables to the electrical equipment.

Attaching the wiring bundles to the face of the enclosure along the cable ways is one of the most time-consuming and delicate steps.

This step requires a great deal of time because the wiring bundles must be fixed manually by operators.

Generally, in the case of a new aircraft, the enclosure is shop wired then, once completed and tested, the combined unit formed by the enclosure and the wiring bundles is installed in the aircraft during the assembly thereof.

It will be appreciated that the wiring operation requires the presence of the bare enclosure, which in this instance poses the problem of availability of the enclosure.

In the case of a minor repair to an aircraft, operators work directly on the faulty cables without dismantling the enclosure, whereas in the case of a major repair, it is necessary to replace the enclosure together with the wiring bundles, which can necessitate partial disassembly of the aircraft to enable the enclosure to be removed.

OBJECTS AND SUMMARY OF THE INVENTION

The aim of the invention is to propose an electrical cabinet that makes it possible in particular to overcome the drawbacks cited hereinbefore.

The invention achieves it aim by the fact that the cabinet additionally includes a wiring support including support elements arranged cross-wise whereon electrical cable bundles are assembled, and by the fact that said wiring support includes fixing means for attachment thereof to the face of the enclosure, said electrical cables being capable of assembly to the wiring support and of forming therewith a subassembly before attachment thereof to said enclosure.

By virtue of the invention, it will be appreciated that the assembly of the electrical cables to the wiring support can be performed without the enclosure. In particular, the step consisting in forming the cable ways, prior to connecting the electrical equipment, can be performed without the enclosure.

The subsequent steps of finishing, final adjustment and testing of the wiring can also be performed without the enclosure.

In other words, the invention makes it possible to carry out the entire wiring operation in the workshop, without requiring the presence of the enclosure and in more favourable ergonomic conditions for the operators. It thus becomes possible to substantially reduce the time required to complete the wiring operation.

Furthermore, as the wiring operation can be performed without the enclosure, this makes it possible to defer installation of the wiring during construction of the aircraft. For example, by virtue of the present invention, the enclosure can be installed bare in the aircraft or can be integrated therein before the wiring operation.

This integration capability is particularly useful in that it enables in particular the enclosure to contribute to the mechanical strength of the aircraft.

Furthermore, the integrated enclosure concept has the advantage of affording the ability to reduce the total weight of the aircraft.

In the case of a major repair, it will be appreciated that the invention facilitates the dismantling operation in that it only requires disassembly of the wiring support rather than a full change-out of the enclosure complete with wiring bundles, which may in some cases require part of the aircraft to be dismantled.

Finishing and final adjustments of the wiring, which were previously carried out after assembly on the enclosure, can now be carried out wholly on the wiring support.

A further advantage is that there is less risk of holding up completion of the wiring operation in case of a delay in delivering the enclosure.

In addition to the benefits associated with assembly, it will be appreciated that the wiring support is also readily detachable and that it is possible to rapidly separate the enclosure and the wiring support whereon the wiring bundles are mounted.

Advantageously, the cross-wise support elements include substantially horizontal cross-members and substantially vertical uprights.

Advantageously, the cross-wise support elements are arranged in at least one substantially vertical plane referred to as a level.

Advantageously, the electrical cable bundles are assembled along the cross-wise support elements.

In a preferred manner, the support elements serve as a guide forming supports for routing of the electrical wiring bundles.

Advantageously, the enclosure includes a plurality of horizontal shelves whereon is disposed the electrical equipment and at least one of the cross-members is disposed in proximity to the plane of one of the shelves.

It will be appreciated that when the wiring support is attached to the enclosure, the wiring bundle, which is assembled on the cross-member disposed in proximity to the plane of one of the shelves, is placed and held in proximity to the electrical equipment, thereby facilitating subsequent connection of the electrical cables to said equipment.

The shelf of which the plane is located in proximity to the cross-member is referred to as the shelf associated with the cross-member.

Preferably, at least one of the cross-members includes at least one earthing module to which the electrical earths of the electrical equipment are connected.

Advantageously, at least one of the cross-members includes at least one horizontal bar supporting at least one of the electrical cable bundles.

Preferably, at least one cross-member includes at least one upper horizontal bar and at least one lower horizontal bar, arranged so that said at least one upper bar is in a horizontal plane situated slightly above the plane of said shelf, and said at least one lower bar is in a horizontal plane situated slightly below the plane of said shelf.

Preferably again, each of the bars is designed to support a bundle of cables which can be connected to an electrical equipment unit located on the associated shelf and/or to an electrical equipment unit located under the associated shelf.

Advantageously, at least one of the cross-members includes two pairs of bars disposed at two separate levels.

Preferably, each pair of bars includes an upper bar and a lower bar.

In a variant, the upper and lower bars are disposed substantially in two separate horizontal planes.

Advantageously, at least one of the bars is locally curved, thereby enabling at least one of the cable bundles to pass from a bar at a first level to a bar at a second level.

Preferably, said bar presents a curved portion which extends in a substantially horizontal plane.

It will be appreciated that local deformation of the bar makes it possible to locally reduce the distance separating two bars contained in the same horizontal plane, for example two upper bars or two lower bars, so that the aforementioned cable bundle can readily pass from the bar disposed at a first level to a bar disposed at a second level, distinct from the first, while at the same time being guided and held secure.

In a preferred manner, two upper, or lower, bars located substantially in the same horizontal plane are both locally curved, so that their respective curved portions are facing one another, thereby enabling the distance separating the two bars to be further reduced.

Naturally, it can also be provided that one of the bars presents a curved portion extending in a substantially vertical, or inclined, plane thereby facilitating the passage of a cable bundle between upper and lower bars disposed at the same level.

Advantageously, in proximity to the intersection of one of the bars and an upright, said bar is locally curved.

Now, it will be appreciated that by virtue of the present invention, the cable bundle supported by the bar is locally deflected in proximity to the upright, so as to bypass the electrical wiring bundle supported by the upright.

In a variant, the upright can be locally curved away from the bundle supported by the bar.

In another variant, at least one of the cross-members additionally includes a rail designed to support at least one of the cable bundles.

Preferably, the rail presents an upper part and a lower part, each of these parts carrying one of the cable bundles.

In another variant, the rail additionally includes bars capable of supporting cable bundles.

Advantageously, the distance between two support elements is designed to satisfy the requirements for segregation between the electrical cable bundles assembled on these two support elements.

In a known manner, the wiring of an electrical cabinet used in the particular field of aircraft engineering must conform to the segregation requirements specified in the aircraft engineering regulations.

The term segregation is understood to mean the action of separating two cable bundles by a sufficient distance so as to preclude problems of cross-talk and electromagnetic disturbance on one hand, and for safety reasons on the other hand.

Physical separation of the bundles makes it possible, for example, to avoid the situation where overheating of one bundle affects an adjacent bundle.

In this instance, there is advantageously provided a sufficient distance between two bars of the same cross-member. Similarly there is advantageously provided a sufficient distance between two bars or rails of two different cross-members so that there exists at all times between two cable bundles a sufficient distance ensuring that the segregation rules are met.

Furthermore, the segregation rules are also met in proximity to the intersection of a bar and an upright by the fact that the horizontal bar or the upright is locally curved. In this instance, it will be appreciated that the cable bundle supported by the horizontal bar and that supported by the upright are at all times spaced sufficiently apart so as to comply with the segregation rules.

Advantageously, the wiring support is metallic.

It can be made of aluminium for example. However, in the case where the support is not required to be electrically conductive, it can advantageously be made of a composite material.

In a preferred manner, the wiring support is composed of cylindrical tubes having no or few fine edges so as to avoid damaging the bundles supported thereby, these tubes being assembled together to form a compact and rigid support.

When the electrical cabinet according to the invention is used in an aircraft, such as an aeroplane, the wiring support can advantageously be electrically connected to the electrical earth of the aircraft. In this case, the electrical earths of the electrical equipment, preferably connected to the earthing modules, are in electrical connection with the electrical earth of the aircraft, enabling in particular the flow of electrostatic charges and any currents induced by lightning.

The wiring support therefore provides electrical earth continuity, which is particularly useful when the enclosure is advantageously made of a non-conducting material, such as a composite material.

Advantageously, the electrical equipment units are disposed in metal carriers capable of being electrically connected to the wiring support.

Such metal carriers are already known in the field of aircraft engineering.

It will be appreciated that electrically connecting the metal carriers to the wiring support is useful in that it serves to maintain electrical continuity between the electrical equipment units and the electrical earth of the aircraft.

The invention also relates to an aircraft including a cabinet according to the present invention, wherein the cabinet includes an enclosure integrated into a principal structure of the aircraft.

In a preferred manner, the principal structure of the aircraft corresponds to the aircraft's metallic framework.

The invention also relates to a wiring support for an electrical cabinet according to the invention, whereon electrical cable bundles are assembled, said wiring support including fixing means for attachment thereof to the face of an enclosure, said electrical cables being capable of assembly to the wiring support before attachment thereof to the enclosure.

The invention also relates to a method of wiring an electrical cabinet, wherein the cable bundles are assembled on the wiring support, the wiring support is attached to the enclosure, and the connectors are attached to the supports

BRIEF DESCRIPTION OF THE DRAWINGS

The invention will be better understood and its advantages more clearly apparent upon reading the following detailed description of three embodiments presented by way of non-limitative examples. The description refers to the attached drawings in which.

MORE DETAILED DESCRIPTION

The electrical cabinet according to the invention is principally designed to be used in an aircraft such as an aeroplane for example. However, this does not constitute a limitation and the electrical cabinet according to the invention can be used highly effectively in fields where it is necessary to connect electrical equipment to electrical cable bundles.

In the following detailed description, three embodiments of the electrical cabinet according to the invention will be described.

FIGS. 1 to 5 illustrate a first embodiment of the electrical cabinet according to the invention.

Figure 1:
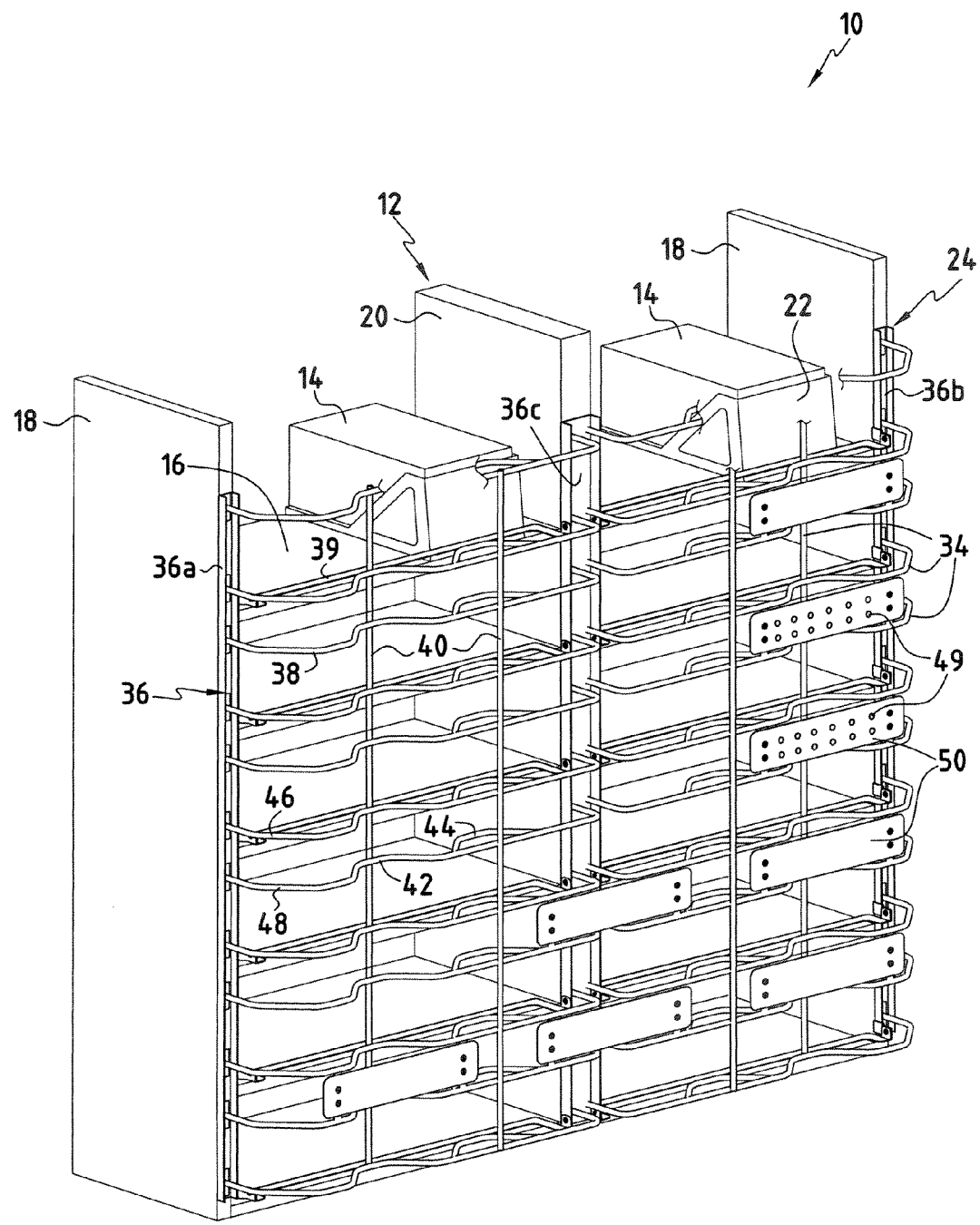
FIG. 1 is a perspective view of the electrical cabinet in a first embodiment of the invention, in which neither the cable bundles nor the electrical equipment are shown.

FIG. 1 depicts an electrical cabinet 10 including an enclosure 12 designed to house a plurality of electrical equipment units 14. Such equipment units 14 are already known in the field of aircraft engineering. They may for example comprise computers, radios or any other type of electrical or electronic equipment.

The enclosure 12 is preferably a shelf unit which in this example includes six shelves 16 each extending in a horizontal plane.

The shelves are held in place by two lateral uprights 18 and a central upright 20, which extend vertically.

Each of the shelves 16 has a sufficient depth to accommodate the electrical equipment units 14.

The electrical cabinet according to the invention is not in any way limited to the use of a shelf unit. It is perfectly possible to use other types of enclosure or housing structure capable of receiving electrical equipment, without exceeding the scope of the present invention.

As can be seen in FIG. 1, the central upright 20 constitutes a plane of symmetry for the shelf unit 12.

Therefore, each of the shelves 16 is symmetrical in relation to the plane of symmetry of the shelf unit 12, thus defining two shelf portions.

In a preferred manner, these two shelf portions house identical or complementary electrical equipment, so as to ensure redundancy of the aircraft's electrical equipment.

As already indicated, redundancy is a specific aspect of the field of aircraft engineering, the purpose of which is to maximise safety on board the aircraft. The idea is that if one electrical equipment unit fails, there is provided a second electrical equipment unit identical to the first designed replace the faulty electrical equipment unit. In this instance, each of the shelf portions houses one of the two aforementioned equipment units.

The electrical cabinet according to the invention therefore includes two preferably but not necessarily identical subsets of electrical equipment.

In a known manner, the electrical equipment units 14 are preferably inserted and held in metal carriers 22 attached to the shelves. The metal carrier 22 can for example take the form of a rack of the ARINC type.

generally, each of the electrical equipment units 14 is connected to other apparatus, for example other electrical equipment units, control elements or sensors, by means of electrical cables carrying various signals.

As the electrical equipment units are redundant, it will be appreciated that it is also necessary for the electrical cables to be redundant.

In accordance with the present invention, these electrical cables are assembled on a wiring support 24 designed to be attached to a face of the enclosure.

In a preferred manner, the electrical cables are first assembled to the wiring support 24, before the latter is fixed to the shelf unit 12. However, the cables can also be assembled after fixing the wiring support to the shelf unit 12.

Figure 3:
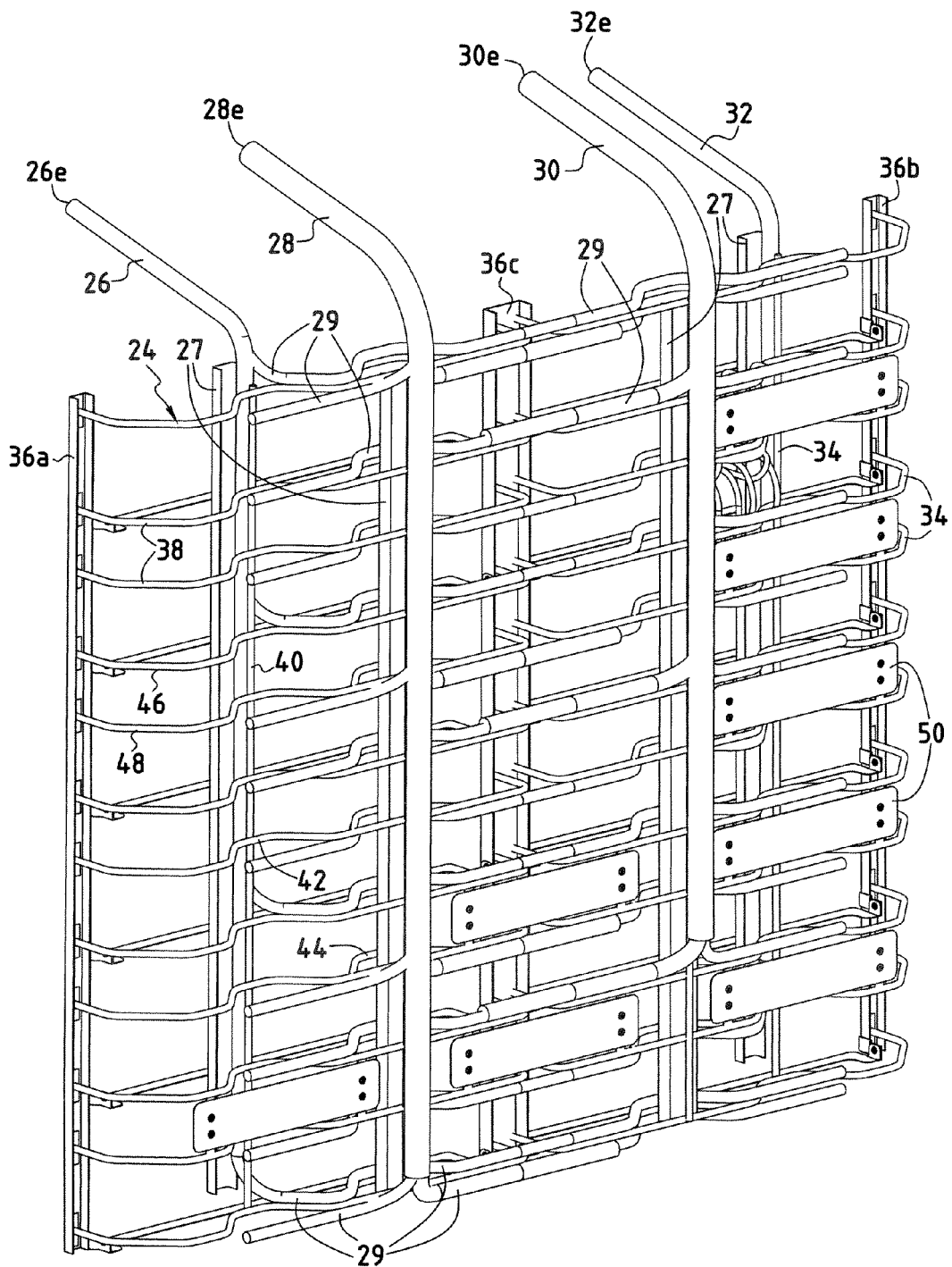
FIG. 3 is a perspective view of the wiring support of the electrical cabinet wherein the cable bundles are assembled, in a first embodiment of the invention.

In the example shown in FIG. 3, each of the electrical equipment units 14 receives two types of signals, designated by the references S and M. By virtue of the redundancy, it will be appreciated that there exists two series 1S, 2S of electrical cables which carry the signals of type S and two series of electrical cables 1M, 2M which carry the signals of type M.

This example therefore represents four series of signals that are also referred to as "routes".

Clearly the invention is not limited to four routes, and there can very well be provided six, eight or more routes.

The electrical cables on the same route are preferably grouped into bundles having a substantially circular cross-section.

As illustrated in FIG. 3, four main cable bundles 26, 28, 30 and 32 corresponding respectively to the routes 1S, 1M, 2M and 2S are led in from a part located above the wiring support. The upstream ends 26e, 28e, 30e and 32e of cable bundles 26, 28, 30 and 32 are capable of being connected to the electrical circuit of the aircraft via a connector not shown here.

In a preferred manner, these main cable bundles 26, 28, 30 and 32 are attached to the wiring support in a manner such that extend in vertical directions.

As can be seen in FIG. 3, the main cable bundles are divided into secondary cable bundles 29 which extend along the cross-members, in proximity to the electrical equipment.

These secondary bundles can also divide further, but this is not shown here.

The electrical equipment units are then connected in a known manner to the electrical cables originating from the cable bundles located in the vicinity thereof.

The wiring support 24 of the electrical cabinet in its first embodiment will now be described in greater detail, before going on to describe how the cable bundles are assembled to the wiring support 24.

The wiring support 24 shown in FIGS. 1 to 5 takes the form of a metallic grid including support elements 34 arranged cross-wise, in this instance substantially horizontal cross-members 38 and substantially vertical uprights 40.

Figure 6:
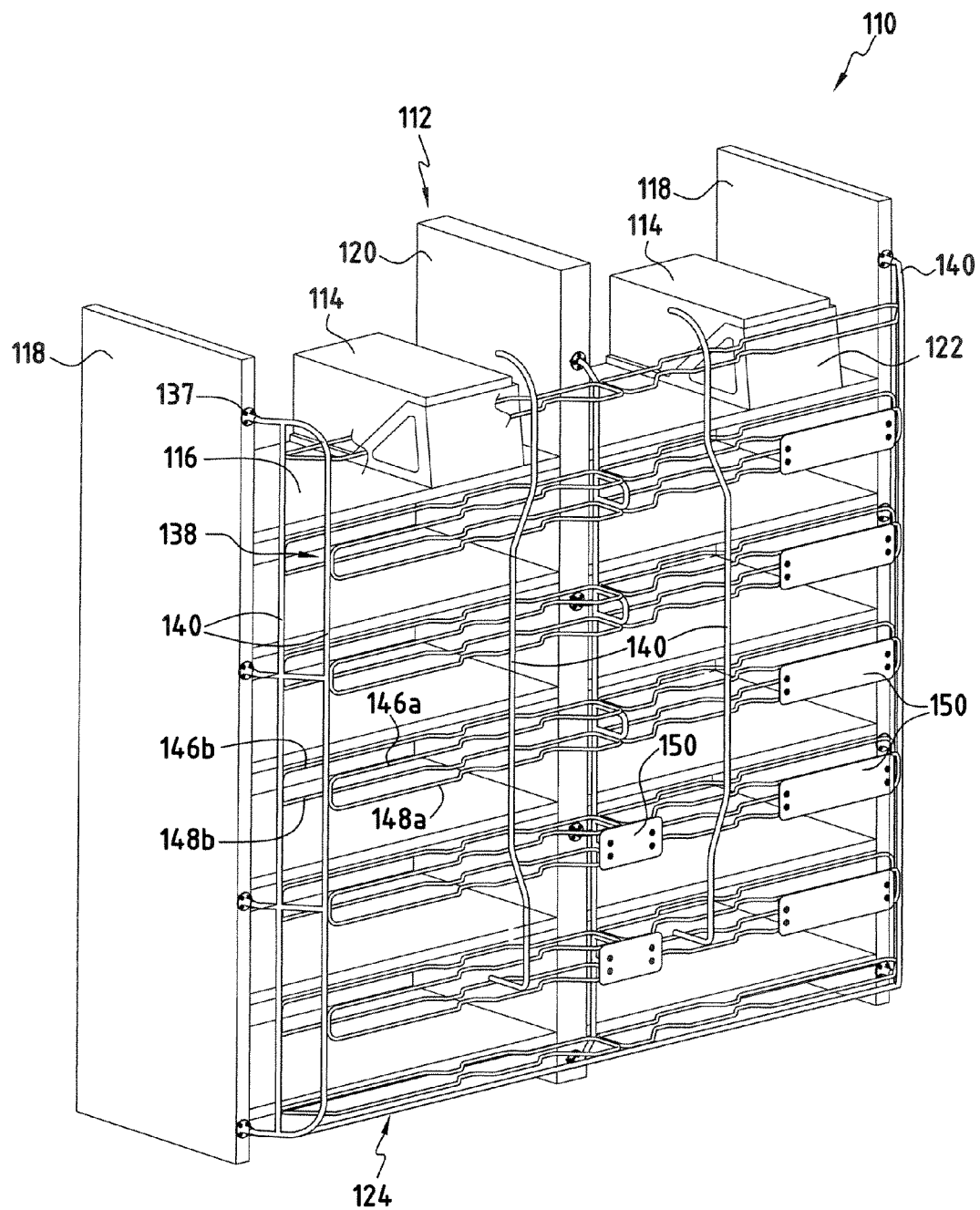
FIG. 6 is a perspective view of the electrical cabinet in a second embodiment of the invention, in which the cable bundles are not shown.
Figure 11:
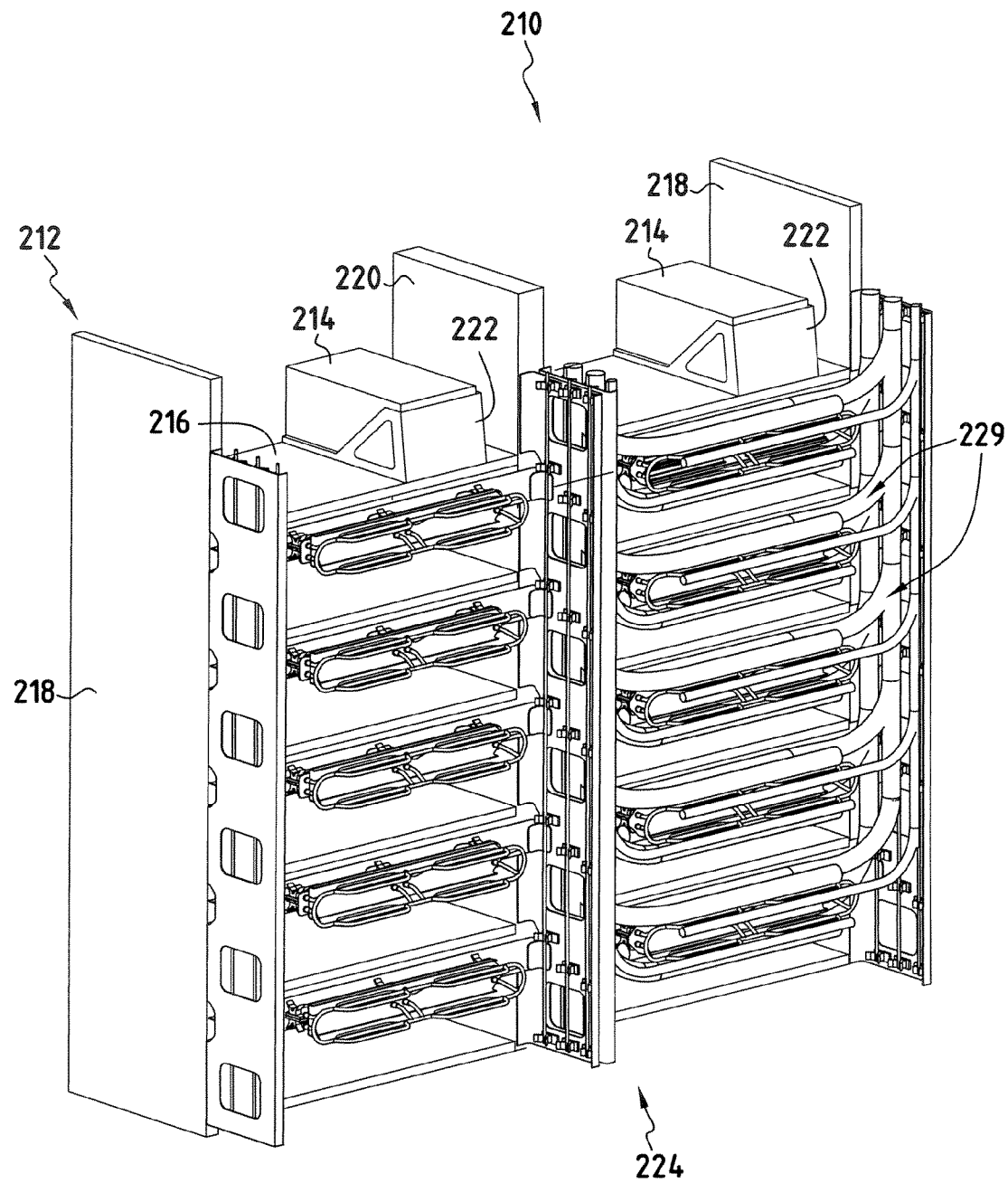
FIG. 11 is a perspective view of the electrical cabinet in a third embodiment of the invention, in which the electrical equipment units are not shown.

As can be seen in FIGS. 1, 6 and 11, the wiring support, when it is fixed to the face of the enclosure, substantially covers the face of the enclosure and extends substantially in a plane parallel to said face.

In a preferred manner, the wiring support 24 has substantially the same dimensions on the height and width as the shelf unit 12.

The cross-members 38 are held at each of their ends by a vertical rail 36. In this instance, the wiring support 24 includes three vertical rails 36, i.e. two vertical rails 36a and 36b located at the ends of the wiring support 24 and a middle vertical rail 36c.

Figure 2:
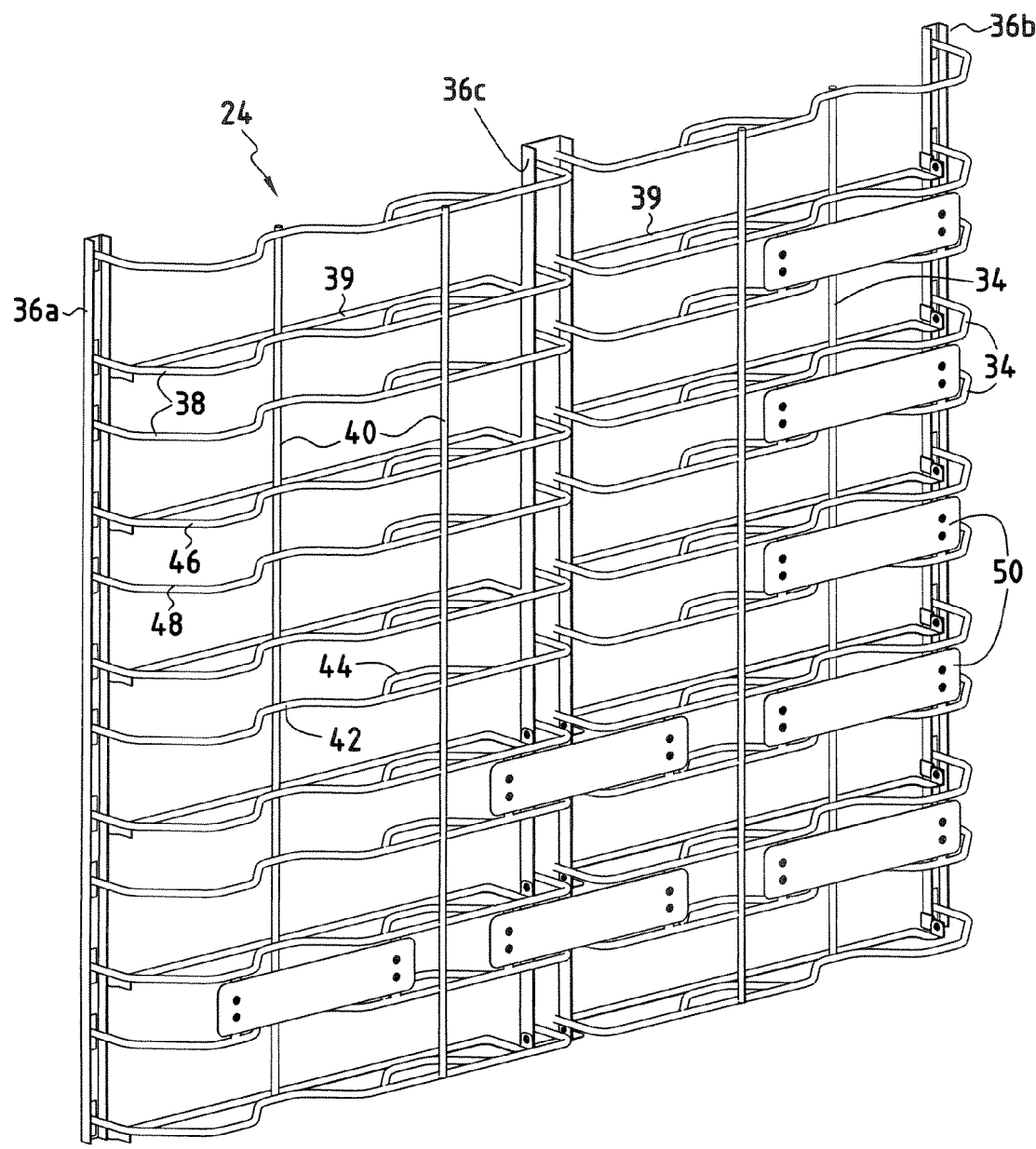
FIG. 2 is a perspective view of the wiring support of the electrical cabinet in a first embodiment of the invention.

As can be seen in FIGS. 1 and 2, the wiring support has the same plane of symmetry as that of the shelf unit, that is to say a vertical plane of symmetry passing through the middle vertical rail 36c.

As can be seen in FIG. 1, the vertical rails 36 constitute the means of fixing the wiring support 24 to the shelf unit 12. As will be appreciated, the vertical rails 36 are fixed to the uprights 18, 20 of the shelf unit 12.

In this embodiment, the cross-members 38 and the uprights 40 take the form of cylindrical metal bars welded together.

In a preferred manner, the wiring support 24 additionally includes vertical uprights 27 forming a protective partition designed to protect the main cables in case of a fire outbreak in an equipment unit 14 located in proximity thereto.

Preferably again, there is provided as many vertical uprights 27 forming a fire-resistant protective partition as there are main cables.

As can be seen in FIGS. 1 to 5, the cross-members 38 include curved portions 42, each of which is contained substantially in a horizontal plane.

The cross-members 38 can additionally include curved bar portions 44, also contained in horizontal planes, the function of which will be explained below.

According to the invention, at least one of the cross-members 38 is disposed in proximity to the plane of one of the shelves 16.

In the example shown here, the cross-members 38 include an upper bar 46 and a lower bar 48, arranged so that the upper bar 46 is contained in a horizontal plane located slightly above the plane of said shelf 16, and the lower bar 48 is contained in a horizontal plane located slightly below the plane of said shelf 16.

However, with regard to the shelf located at the foot of the enclosure 12 and that located at the top of the enclosure, it is seen that a single upper bar extends in proximity to these shelves.

The wiring support additionally includes a plurality of earthing modules 49 to which the electrical earths of the electrical equipment units 14 are connected. In a preferred manner, the earthing modules are mounted on plates 50 fixed directly to the wiring support 24.

The plates 50 can also serve to carry any other electrical component, such as terminal rails.

As can be seen in FIGS. 1 to 3, each of the plates 50 is fixed between the upper bar 46 and the lower bar 48 of one of the cross-members 38.

This arrangement avoids obstructing the space between two adjacent cross-members 38, thereby enabling the operators to electrically connect the cable bundles to the carriers 22.

In addition, there is provided as many uprights 40 as there are routes. In this instance, the wiring support includes two pairs of uprights 40 which extend substantially over the full height of the wiring support 24.

Viewed in the direction of the width of the wiring support 24, each of the pairs of uprights 40 is preferably disposed between an end vertical rail 36a or 36b and the middle vertical rail 36c.

In addition, the cross-members 38 include metal strips 39 extending horizontally between the vertical rails. In this instance, there is provided as many metal strips 39 as there are shelves 16. The metal strips 39 are designed to ensure electrical continuity between the metal carriers 22 and the wiring support 24, so as to facilitate earthing of the equipment.

With reference to FIG. 3, the manner in which the electrical cable bundles 26, 28, 29, 30 and 32 are assembled to the wiring support 24 described hereinbefore will now be described.

The main cable bundles 26, 28, 30 and 32 are preferably assembled to the four uprights 40 of the wiring support 24, and the secondary cable bundles 29 are in turn attached to the cross-members 38 so as to extend horizontally on substantially the full width of the wiring support 24.

In a preferred manner and for reasons explained below, each of the horizontal bars 46 and 48 only carries, within the same portion, a single secondary cable bundle 29.

As can be seen in FIG. 3, it is not necessary for all of the main cable bundles to extend over the full height of the wiring support 24.

The function of the curved portions 42 and 44 described above will now be explained.

As already mentioned, the electrical cabinet 10 according to the invention is designed to conform to the regulations in terms of segregation.

This means that it is necessary to maintain a minimum distance between two different cable bundles, so that no interference occurs between the signals carried by these two cable bundles.

It will then be appreciated that the curved portions 42 and 44 serve to locally divert one of the secondary cable bundles 29 when it crosses another.

For example, provision can be made in proximity to the intersection of one of the bars 46, 48 and an upright 40, for said bar 46, 48 to be locally curved in a manner such that the horizontally disposed secondary cable bundle 29 is locally diverted to avoid the main cable bundle 26, 28, 30, 32 which it crosses. Such a diversion can be seen in particular in FIG. 5.

It will thus be appreciated that a minimum distance can be maintained between the two cable bundles.

In addition, provision is made for the distance between the upper 46 and lower 48 horizontal bars of the same cross-member 38 to be sufficiently large to separate the cable bundles so as to conform to the segregation rules.

For similar reasons, the uprights 40 are sufficiently spaced apart so that the main cable bundles 26, 28, 30, 32 have no mutual interference therebetween.

Figure 4:
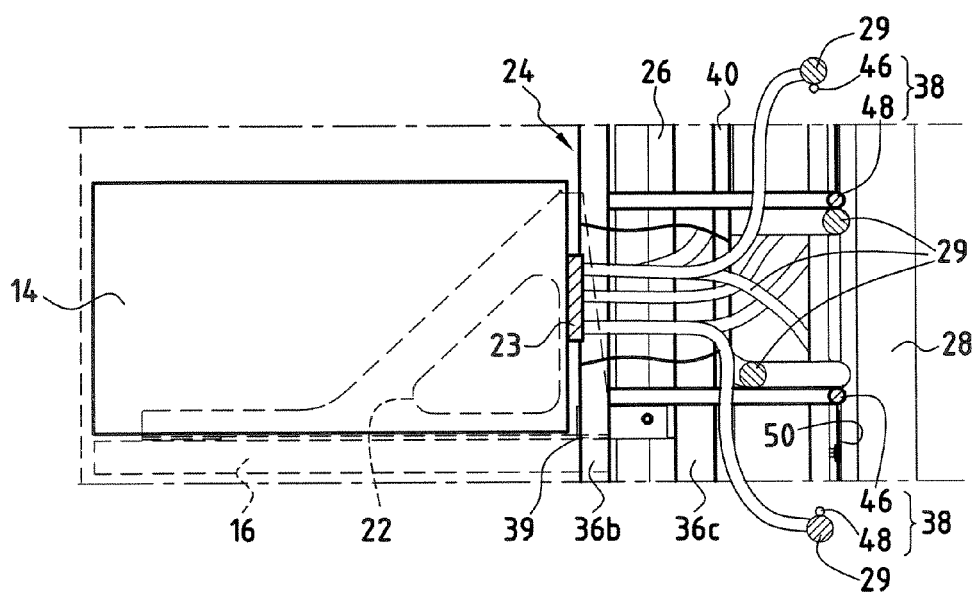
FIG. 4 is a sectional side view of the wiring support in FIG. 3, in which a connection of one of the electrical equipment units is shown.
Figure 5:
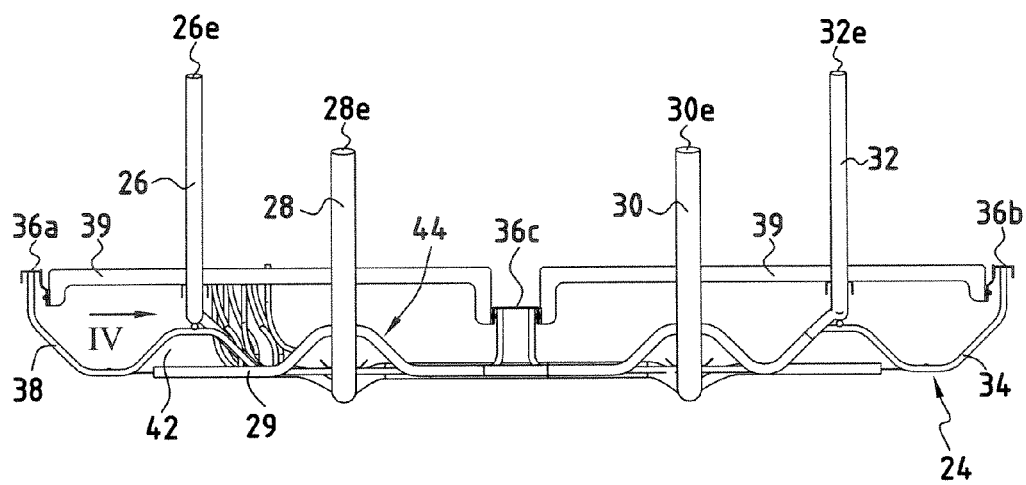
FIG. 5 is a top view of the wiring support in FIG. 3.

FIG. 4 schematically illustrates the connection of one of the electrical equipment units 14. This electrical equipment 14 is connected to each of the four routes 1S, 1M, 2S and 2M. In this instance, four electrical cables originate from four secondary bundles 29 supported on one hand by the bars 46 and 48 of the cross-member 38 disposed in proximity to the plane of the shelf 16 carrying the unit 14, and on the other hand by the bars 46 and 48 of the cross-member immediately above.

As can be seen in this figure, the electrical cables are connected to the electrical equipment unit 14 via a connector 23 connected to the wiring, which is attached to the rear of the metal carrier 22 during assembly of the wiring support 24 on the shelf unit 12.

In a known manner, the electrical equipment unit 14 includes a connector designed to be plugged into the connector of the metal carrier 22.

In a preferred manner, the distance separating two bars of two adjacent cross-members is sufficiently large so that an operator can attach the connector 23 to said metal carrier 22, and can manipulate the electrical cables if necessary.

With reference to FIGS. 6 to 10, a second embodiment of the electrical cabinet according to the invention will now be described.

The second embodiment includes certain elements already described in the first embodiment. These identical elements have the same numerical reference as that of the element described in the first embodiment, increased by one hundred.

In this second embodiment, the enclosure 112 of the cabinet 110 is the same as that used in the first embodiment. However, the electrical cabinet 110 is designed to house electrical equipment units 114 requiring three different signals, that is to day the wiring support carries six routes for reasons of redundancy.

For the sake of legibility, the cable bundles are not shown in FIG. 6.

Figure 7:
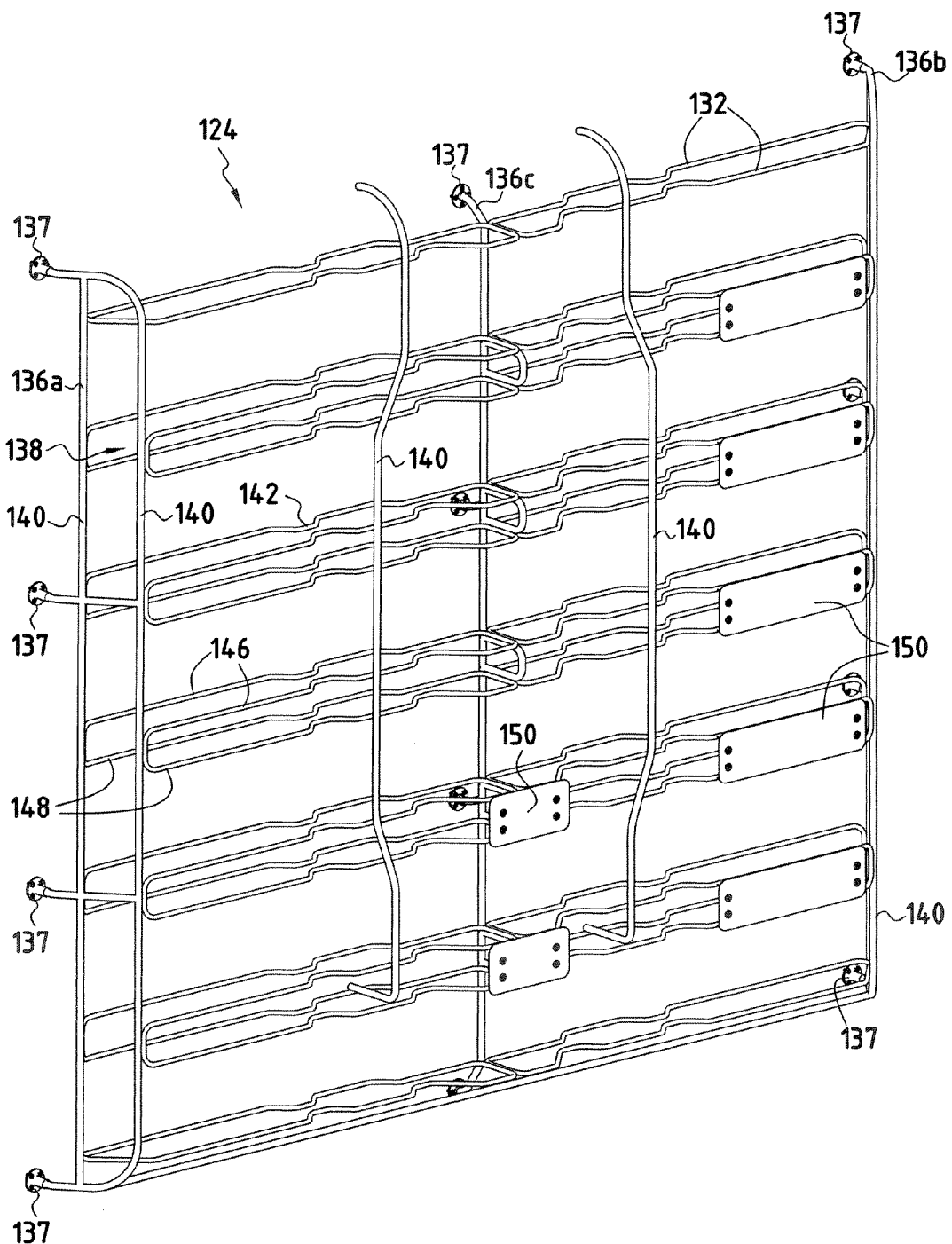
FIG. 7 is a perspective view of the wiring support of the electrical cabinet in a second embodiment of the invention.

FIG. 7 depicts the wiring support 124 of the second embodiment of the electrical cabinet 110 according to the invention.

The wiring support 124 also takes the form of a grid including support elements arranged cross-wise in the form of uprights 140 and cross-members 138.

In the example shown, the wiring support 124 includes six uprights 140, each of the lateral ends of the wiring support 124 including two uprights 140.

In this embodiment, vertical end rails 136a and 136b are constituted by the uprights 140 located at these ends.

As can be seen in FIGS. 6 and 7, the means of attaching the wiring support 124 to the shelf unit 112 are constituted by fixing lugs 137 extending from the uprights 140 which are located at the ends of the wiring support 124, and from a central upright located in the plane of symmetry of the wiring support 124.

In the example shown, the wiring support 124 includes seven cross-members 138 having substantially horizontal bars.

Figure 9:
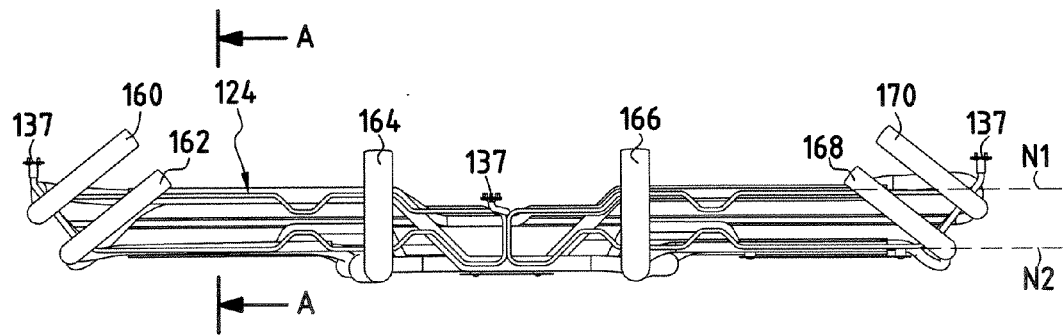
FIG. 9 is a top view of the wiring support of the electrical cabinet wherein the cable bundles are assembled, in a second embodiment of the invention.

The bars 146, 148 are contained in two distinct vertical planes N1, N2, also referred to as levels visible in FIG. 9. A first level N1 is distinguished from a second level N2, the first level N1 being that which is located closer to the shelf unit 112.

Apart from the cross-members 138 located at the upper and lower ends of the wiring support 124, each cross-member 138 includes two pairs of horizontal bars, each of the pairs including an upper bar 146 and a lower bar 148.

It is also seen that the two upper bars 146a, 146b of the same cross-member are located substantially in the same horizontal plane. The same is true of the two lower bars 148a, 148b of said cross-member 138.

As can be seen in FIG. 7, the bars also include curved portions 142.

As can be seen more particularly in FIG. 9, the two upper bars 146a, 146b of one of the cross-members 138 each include a curved portion extending in a horizontal plane, these two curved portions 142 being disposed facing each other so that the distance between the two bars 146a, 146b is locally reduced. The same is true of the two lower bars 148a, 148b. The advantage of this local reduction of distance will be explained below.

The wiring support 124 also includes plates 150 fixed between the upper 146a and lower 148a bars of the second level N2 of one of the cross-members 138. This plate 150 is designed to receive earthing modules such as described in the first embodiment, or any other electrical component.

The cross-member located at the bottom end of the wiring support 124 includes only a pair of upper bars 146a, 146b, while the cross-member 138 located at the upper end of the wiring support 124 includes only a pair of lower bars 148a, 148b.

Figure 8:
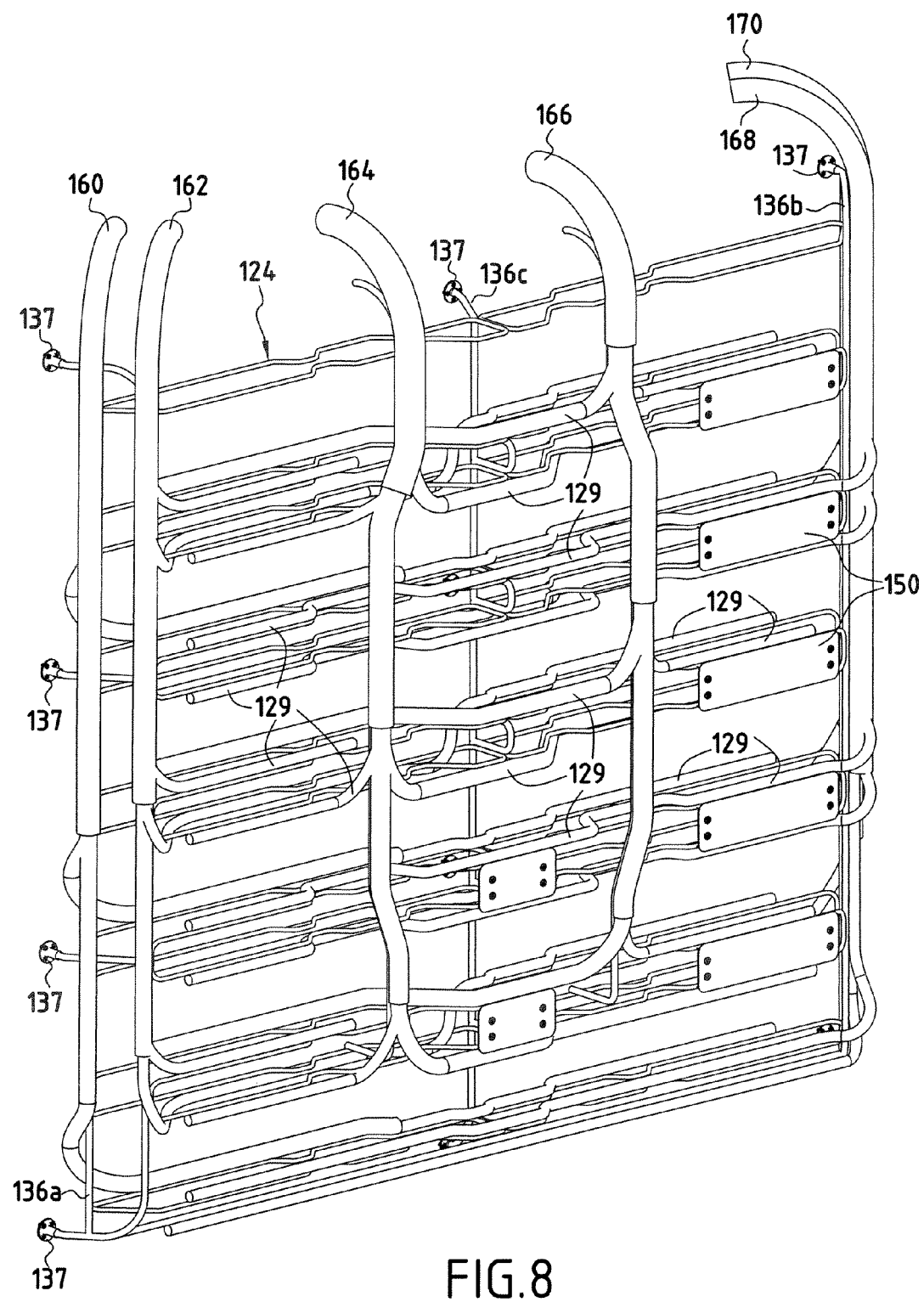
FIG. 8 is a perspective view of the wiring support of the electrical cabinet wherein the cable bundles are assembled, in a second embodiment of the invention.
Figure 10:
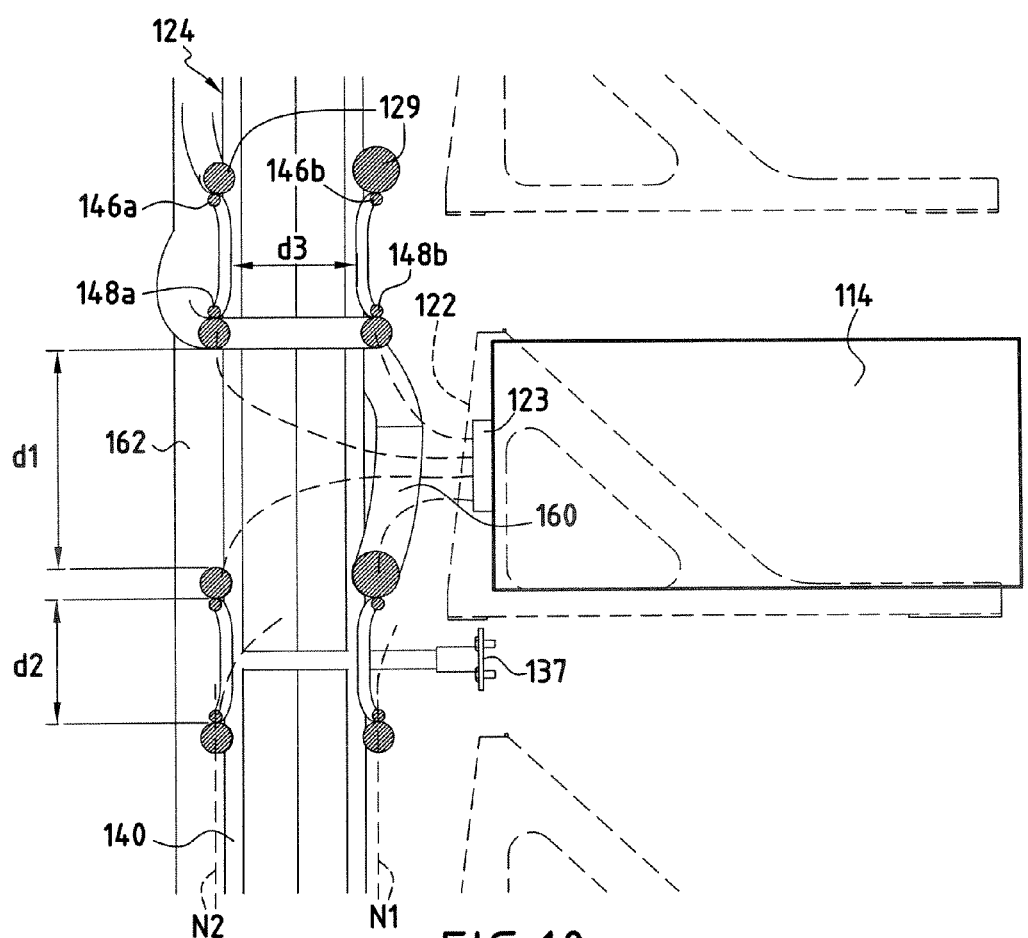
FIG. 10 is a sectional side view on A-A of the wiring support in FIG. 9.

With reference to FIGS. 8 to 10, the assembly of the cable bundles to the wiring support 124 of the electrical cabinet 110 according to the second embodiment will now be described.

The six signal routes 160, 162, 164, 166, 168 and 170 are led in via main cable bundles from the upper part of the electrical cabinet 110.

As in the first embodiment, each of the main cable bundles is supported by one of the uprights 140. These main bundles are divided into secondary cable bundles 129 extending horizontally along the bars 146, 148.

More precisely, the bars 146, 148 support and guide the secondary cable bundles 129.

Curved portions 142 detailed above serve to guide the secondary cable bundle at a change of level N1, N2.

In effect, provision is made for the secondary cable bundles to pass from a bar at the first level N1 to a bar at the second level N2, and vice versa.

In a preferred manner, when one of the cable bundles passes from one level to the other, it remains substantially in the same horizontal plane.

It can be envisaged however to provide curved portions 142 that are not located in horizontal planes and which serve to guide a secondary cable bundle from a lower bar 148 to an upper bar 146 (or vice versa) of the same cross-member 138.

One of the advantages of changing levels is to prevent collision between two secondary cable bundles 129 located on the same bar. By reason of the large number of cable bundles 129, it is perfectly possible for two secondary cable bundles 129 to be supported, at different portions, by the same bar, in this instance at each of its ends. This particular case can be seen in FIG. 8.

It will be appreciated that these cable bundles must not cross on the same bar 146, 148. It is therefore provided that one of the two aforementioned secondary cable bundles is diverted to another level N1, N2 so that the two secondary cable bundles 129 are always spaced sufficiently far apart.

In addition, as in the first embodiment, a secondary cable bundle 129 can be locally diverted by means of the curved portions 142 so as to avoid one of the main cable bundles 160, 162, 164, 166, 168 and 170 extending vertically.

The curved portions 142 can be seen in particular in FIG. 9 depicting a top view of the wiring support 124.

FIG. 10 illustrates a sectional side view AA of the wiring support 124. The ARINC type metal racks 122 designed to receive the electrical equipment units 114 are shown by dotted lines.

As can be seen in this example, the upper and lower bars of the same cross-member 138 are spaced apart by a distance d2 of approximately 80 mm.

The distance d3 between two levels N1, N2 is approximately 85 mm.

In addition, the horizontal bars of two adjacent cross-members are spaced apart by a distance d1 of at least 140 mm, which enables an operator to fix the connector 123 to the metal carrier 122, and if necessary to intervene manually on the electrical cables, between two adjacent cross-members.

These three distance values d1, d2 and d3 are given by way of illustration and in no way constitute a limitation.

With reference to FIGS. 11 to 15, a third embodiment of the electrical cabinet according to the invention will now be described.

The third embodiment includes certain elements already described in the first two embodiments These identical elements have the same numerical reference as that of the element described in the first embodiment, increased by two hundred.

FIG. 11 depicts the electrical cabinet 210 according to the third embodiment of the invention.

The shelf unit 212, the metal carriers 222 and the electrical equipment units 214 have already been described for the first two embodiments.

Figure 12:
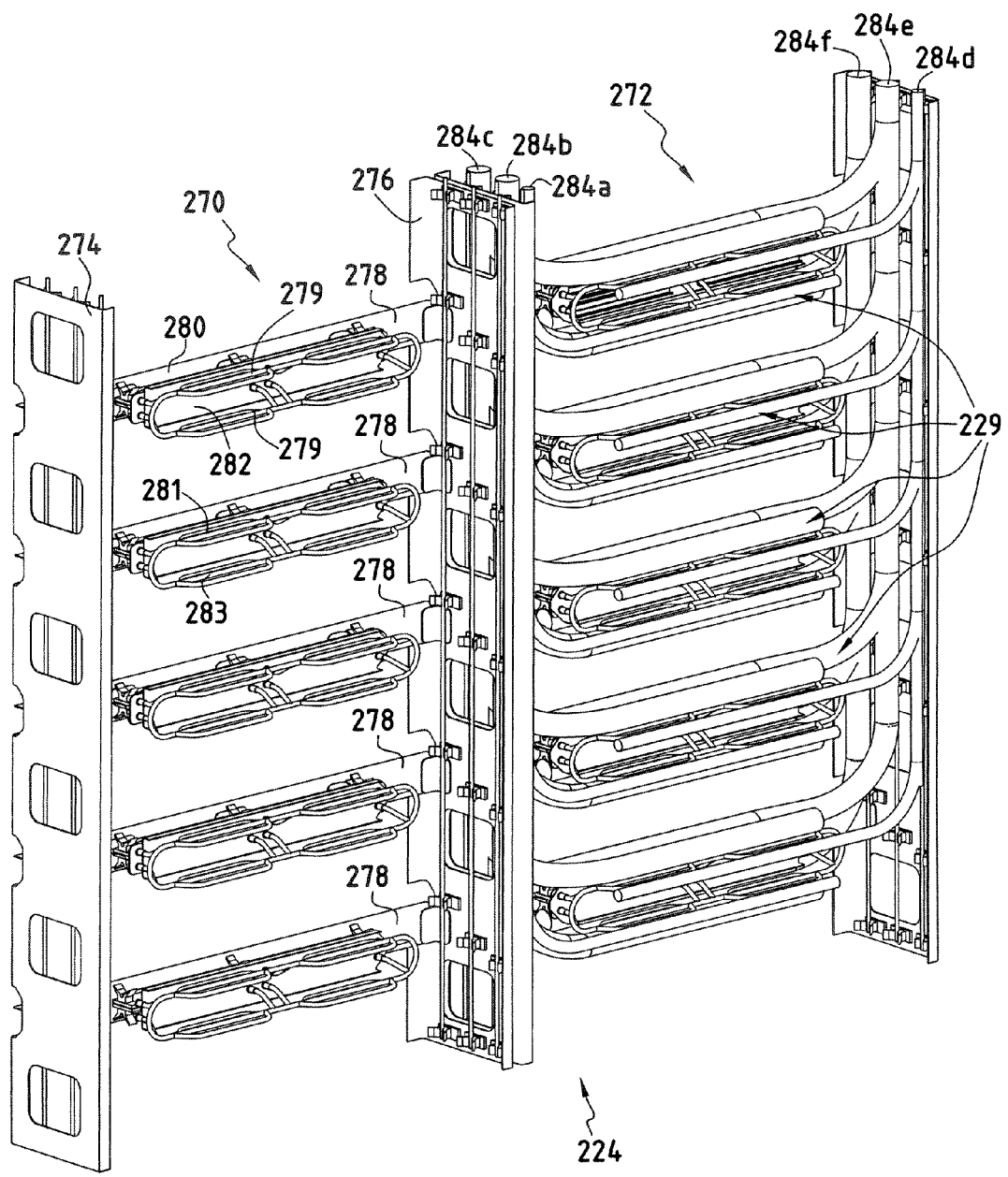
FIG. 12 is a perspective view of the wiring support of the electrical cabinet in a third embodiment of the invention, where part of the electrical wiring bundles is shown.

The essential difference in this case lies in the wiring support 224, which can be clearly seen in FIG. 12.

The wiring support 224 is formed by two identical or symmetrical assemblies, referred to as chassis 270, 272, arranged side by side in a manner such that the wiring support 224 presents a vertical plane of symmetry.

FIG. 12 shows a first chassis 270 and a second chassis 272 together forming the wiring support 224.

The two chassis 270 and 272 being identical, only the first chassis 270 will be described.

As can be seen in FIG. 12, the chassis 270 has the general form of a ladder including, in the example shown here, two vertical uprights 274, 276 and five horizontal cross-members 278. Each of the two uprights 274, 276 substantially takes the form of an elongated rectangular plate extending vertically and disposed in a plane substantially orthogonal to the face of the enclosure to which the wiring support is fixed.

Each of the horizontal cross-members 278 includes an elongated horizontal plate 280 extending between the two uprights 274, 276, disposed in a plane substantially parallel to the face of the enclosure 212 to which the wiring support 224 is fixed.

Each of the horizontal plates 280 is fixed by its ends to lateral edges of the uprights 274, 276.

When the wiring support 224 is attached to the enclosure of the electrical cabinet according to the third embodiment of the invention, it is seen that each of the cross-members 278 is disposed substantially in the extended plane of one of the shelves 216.

Figure 14:
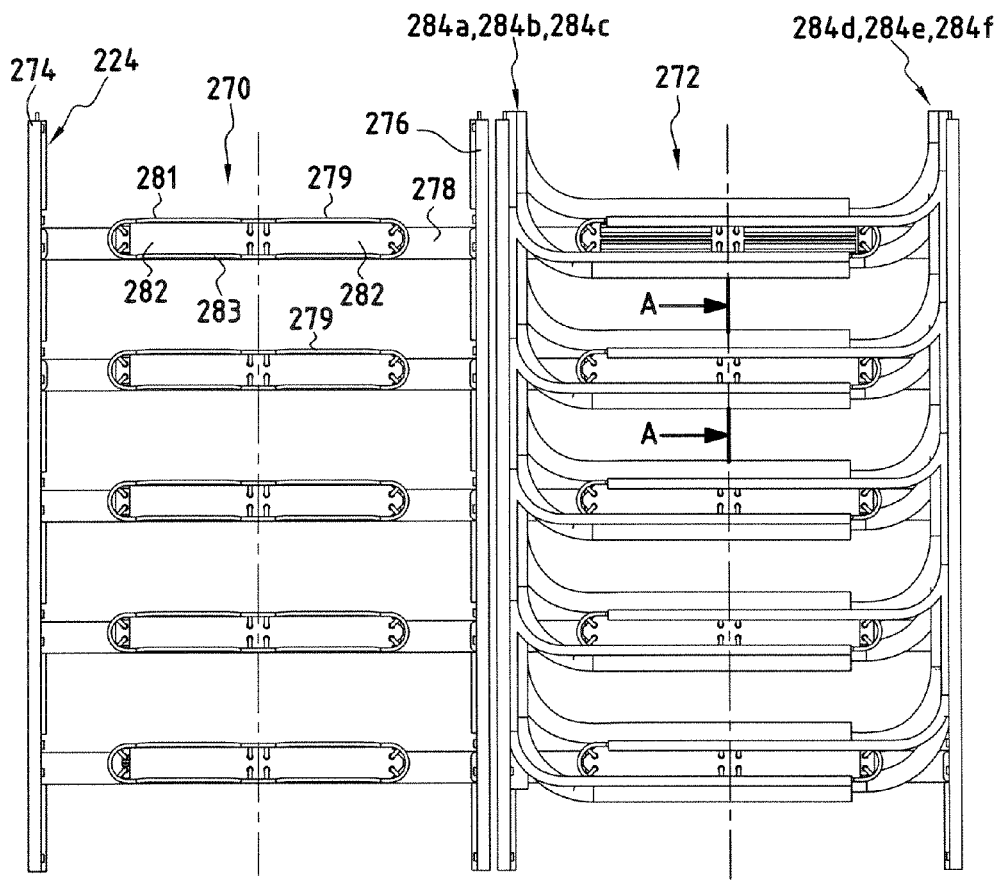
FIG. 14 is a front view of the wiring support in FIG. 12.
Figure 13:
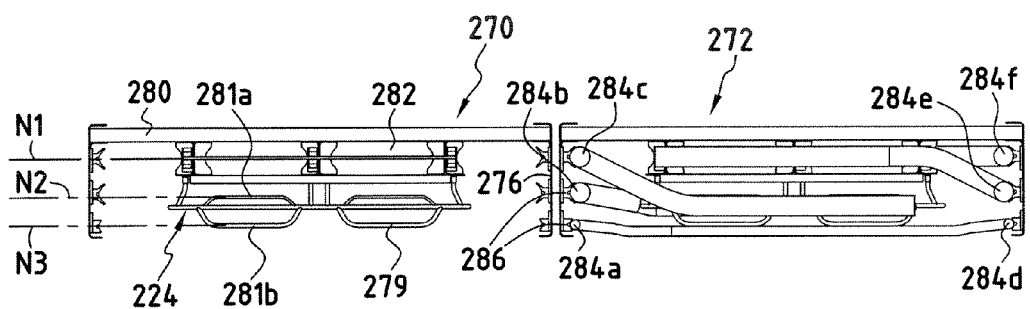
FIG. 13 is a top view of the wiring support in FIG. 12.

As can be seen in FIGS. 13 and 14, each of the cross-members 278 additionally includes a rail 282 fixed along the horizontal plate 280. This rail 282 includes a lower part and an upper part whereon means are disposed to support cable bundles 229 in a first vertical plane N1.

Each of the cross-members 278 additionally includes bars 279 fixed to the rail 282 and extending horizontally, parallel to the direction of the rail 282.

These bars 279 comprise a pair of upper bars 281 and a pair of lower bars 283, each of the two pairs being disposed in a substantially horizontal plane.

In addition, each of the aforementioned pairs of bars 281, 283 includes a first bar 281a, 283a, disposed in a second vertical plane N2 and a second bar 281b, 283b disposed in a third vertical plane N3 distinct form the first, the two vertical planes being parallel to the face of the enclosure 212.

With reference to FIGS. 12 and 14, the manner in which the cable bundles 229 are assembled to the support members constituted by the rails 282 and the bars 279 will now be described.

The wiring support 224 is designed to accommodate six routes 284a, 284b, 284c, 284d, 284e and 284f corresponding in fact to three types of signals S, M and R, known in themselves, which are duplicated for reasons of redundancy.

The main cable bundles corresponding to these routes are brought to the wiring support 224 from an area located above the wiring support.

Each of the chassis uprights 274, 276 is designed to support three main cable bundles extending vertically along said upright 274, 276.

As can be seen in FIG. 13, the main cable bundles are held substantially mutually parallel by seatings 286 fixed along the uprights.

These seatings 286 make it possible to maintain a sufficient distance between the main cable bundles over the full height of the wiring support 224. The segregation rules are therefore met with regard to the main cable bundles.

From each of the main cable bundles, and for each of the cross-members 278, there emerges a secondary cable bundle 229 extending substantially horizontally.

Figure 15:
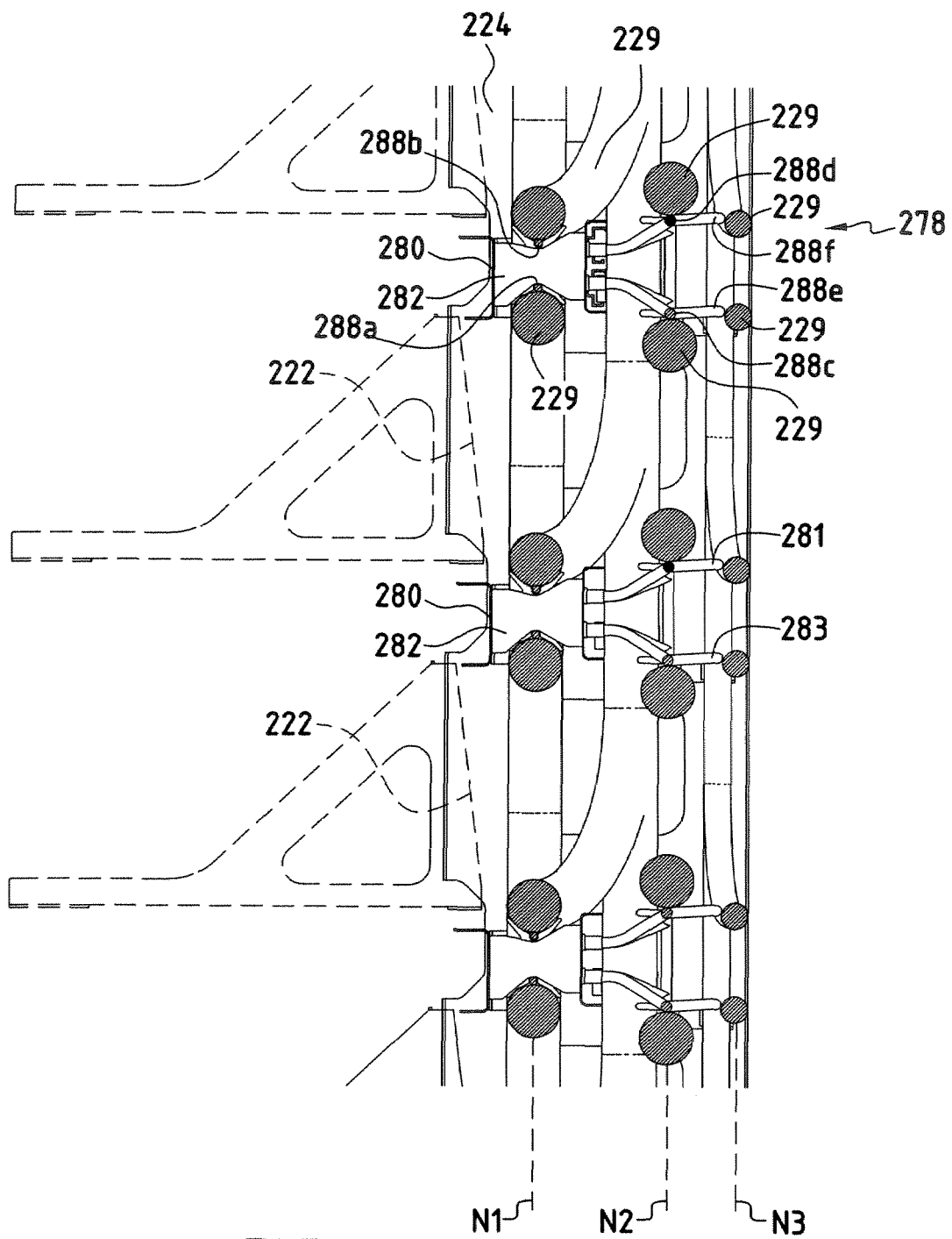
FIG. 15 is a sectional side view on A-A of the wiring support in FIG. 14 which shows details of the segregation between the cable bundles of two adjacent cross-members of the wiring support.

As can be seen in FIG. 15, each of the cross-members 278 includes six support means referenced 288a, 288b, 288c, 288d, 288e and 288f, designed to support six secondary cable bundles 229 derived from the aforementioned six routes. As has already been seen above, a rail 282 is designed to carry two secondary cable bundles 229 and the aforementioned two pairs of horizontal bars 281, 283 are designed to carry four secondary cable bundles 229.

The six support means 288a, 288b, 288c, 288d, 288e and 288f are arranged so as to hold the secondary cable bundles 229 apart from each other in order to conform to the segregation rules.

This type of electrical cabinet is particularly advantageous when the enclosure is of large dimensions. It is then possible to use several chassis disposed side by side.

It is also particularly useful in cases where the segregation rules are stringent and the cable bundles must be spaced a sufficient distance apart. The considerable depth of the uprights 274, 276 makes it possible to ensure the segregation of the secondary cable bundles 229.

The wiring support 224 of the electrical cabinet 210 according to the third embodiment of the invention provides a rigid structure enabling it to be used in conditions of severe mechanical stresses.

The invention also relates to a method of wiring an electrical cabinet according to the present invention.

According to this method, there is provided at one's disposal electrical cables grouped into cable bundles of which the ends are fitted with connectors, each of the bundles corresponding to a particular signal.

There is also provided at one's disposal the wiring support 24, 124, 224 according to the invention. However, at this stage, it is not necessary to have at one's disposal either the enclosure 12, 112, 212 or the electrical equipment units 14, 114, 214.

The cable bundles are then assembled to the wiring support. To do this, the main cable bundles are assembled to the uprights, while the secondary cable bundles 29, 129, 229 leading from the main cable bundles are assembled to the cross-members 38, 138, 280.

In this instance, the secondary cable bundles 29, 129, 229 are assembled to the bars 46, 48, 146, 148 and/or to the rails 282, depending on the embodiment of the electrical cabinet.

In this instance, the secondary cable bundles 229 are fixed to the bars, to the rails or to the uprights by means of ties not shown here.

It is then possible to perform the operations of finishing, final wiring modifications and electrical testing of the wiring assembly.

When these operations are complete, the wiring support 24, 124, 224 can then be attached to the face of the enclosure 12, 112, 212, then the connectors are fixed to the metal carriers into which the electrical equipment units are inserted.

Apart from the last two steps, it will be appreciated that wiring operation can be advantageously performed in the absence of the enclosure and the electrical equipment units.

What is claimed is:

1. An electrical cabinet including:
   an enclosure designed to house a plurality of electrical equipment units,
   a plurality of electrical cable bundles attached to a face of the enclosure for the electrical connection of said electrical equipment units,
   wherein the cabinet additionally includes a wiring support including support elements arranged cross-wise whereon electrical cable bundles are assembled, wherein said wiring support, when attached to the face of the enclosure, extends substantially in a plane parallel to said face of the enclosure, wherein said wiring support includes fixing means for its attachment to the face of the enclosure, it being possible to assemble said electrical cables to the wiring support before attaching said wiring support to said enclosure, wherein the cross-wise support elements include substantially horizontal cross-members and substantially vertical uprights, wherein the enclosure includes a plurality of horizontal shelves whereon are disposed the electrical equipment units, and wherein at least one of the cross-members is disposed in proximity to the plane of one of the shelves.

2. An electrical cabinet according to claim 1, wherein the cross-wise support elements are disposed in at least one substantially vertical plane referred to as a level.

3. An electrical cabinet according to claim 1, wherein the electrical cable bundles are assembled along the cross-wise support elements.

4. An electrical cabinet according to claim 1, wherein at least one of the cross-members includes at least one earthing module to which are connected the electrical earths of the electrical equipment units.

5. An electrical cabinet according to claim 1, wherein at least one of the cross-members includes at least one horizontal bar carrying at least one of the electrical cable bundles.

6. An electrical cabinet according to claims 2 or 5, wherein at least one of the cross-members includes at least one pair of bars disposed at least two distinct levels.

7. An electrical cabinet according to claim 6, wherein at least one of the bars is locally curved, so as to be capable of allowing at least one of the cable bundles to pass from a bar at a first level to a bar at a second level.

8. An electrical cabinet according to claim 5, wherein the bars comprise cylindrical metal rods welded together.

9. An electrical cabinet according to claim 5, wherein in proximity to the intersection of one of the bars and an upright, said bar is locally curved.

10. An electrical cabinet according to claim 1, wherein at least one of the cross-members additionally includes a rail designed to support at least one of the cable bundles.

11. An electrical cabinet according to claim 1, wherein the distance between two cross-wise support elements is designed to maintain the required segregations between the electrical cable bundles assembled on these two support elements.

12. An electrical cabinet according to claim 1 used in an aircraft, wherein the wiring support is metallic and wherein it is electrically connected to an electrical earth of the aircraft.

13. An electrical cabinet according to claim 1, wherein the electrical equipment units are disposed in individual metal carriers designed to be electrically connected to the wiring support.

14. An electrical cabinet according to claim 1, wherein the enclosure is made of a non-conducting material.

15. An electrical cabinet according to claim 1, wherein the wiring support has substantially the same dimensions on the width and height as the enclosure.

16. An aircraft including a cabinet according to claim 1, wherein the cabinet includes an enclosure integral with a principal structure of the aircraft.

17. A wiring support for an electrical cabinet according to claim 1.

18. A method of wiring an electrical cabinet according to claim 1, wherein the cable bundles are assembled on the wiring support, the wiring support is fixed to the enclosure and connectors are attached to an equipment carriers.

19. An electrical cabinet including:
   an enclosure designed to house a plurality of electrical equipment units,
   a plurality of electrical cable bundles attached to a face of the enclosure for the electrical connection of said electrical equipment units,
   wherein the cabinet additionally includes a wiring support including support elements arranged cross-wise whereon electrical cable bundles are assembled, wherein said wiring support, when attached to the face of the enclosure, extends substantially in a plane parallel to said face of the enclosure, wherein said wiring support includes fixing means for its attachment to the face of the enclosure, it being possible to assemble said electrical cables to the wiring support before attaching said wiring support to said enclosure, wherein the cross-wise support elements include substantially horizontal cross-members and substantially vertical uprights, wherein the cross-wise support elements are disposed in at least one substantially vertical plane referred to as a level, wherein at least one of the cross-members includes at least one horizontal bar carrying at least one of the electrical cable bundles, wherein at least one of the cross-members includes at least one pair of bars disposed at least two distinct levels, and wherein at least one of the bars is locally curved, so as to be capable of allowing at least one of the cable bundles to pass from a bar at a first level to a bar at a second level.

20. An electrical cabinet according to claim 19, wherein the distance between two cross-wise support elements is designed to maintain the required segregations between the electrical cable bundles assembled on these two support elements.

21. An electrical cabinet including:

an enclosure designed to house a plurality of electrical equipment units, a plurality of electrical cable bundles attached to a face of the enclosure for the electrical connection of said electrical equipment units, wherein the cabinet additionally includes a wiring support including support elements arranged cross-wise whereon electrical cable bundles are assembled, wherein said wiring support, when attached to the face of the enclosure, extends substantially in a plane parallel to said face of the enclosure, wherein said wiring support includes fixing means for its attachment to the face of the enclosure, it being possible to assemble said electrical cables to the wiring support before attaching said wiring support to said enclosure, wherein the cross- wise support elements include substantially horizontal cross-members and substantially vertical uprights, wherein at least one of the cross-members includes at least one horizontal bar carrying at least one of the electrical cable bundles, and wherein in proximity to the intersection of one of the bars and an upright, said bar is locally curved.

22. An electrical cabinet according to claim 21, wherein the distance between two cross-wise support elements is designed to maintain the required segregations between the electrical cable bundles assembled on these two support elements.

* * * * *